United States Patent [19]

Smith et al.

[11] Patent Number: 4,476,554

[45] Date of Patent: * Oct. 9, 1984

[54] SOUND ACTUATED LIGHT SWITCH

[75] Inventors: Blaine M. Smith; James A. Taylor, both of Beaverton, Oreg.

[73] Assignee: Jonathan Ehrenreich, Ehrenreich Electronics, New York, N.Y.

[*] Notice: The portion of the term of this patent subsequent to Nov. 4, 2000 has been disclaimed.

[21] Appl. No.: 516,223

[22] Filed: Jul. 21, 1983

Related U.S. Application Data

[63] Continuation of Ser. No. 273,570, Jun. 16, 1981, Pat. No. 4,408,308.

[51] Int. Cl.³ .................. G08B 13/22; H01H 36/00; H01H 35/24; H04Q 1/18
[52] U.S. Cl. .................................. 367/197; 307/117; 340/825.72; 340/565
[58] Field of Search .......................... 367/197–199; 307/117; 340/825.72, 565, 566; 315/291

[56] References Cited

U.S. PATENT DOCUMENTS

| | | | |
|---|---|---|---|
| 3,049,699 | 8/1962 | Larrick et al. | 340/261 |
| 3,459,961 | 8/1969 | Ravas | 307/117 |
| 3,475,751 | 10/1969 | Santag et al. | 340/416 |
| 3,514,690 | 5/1970 | Quiros | 323/4 |
| 3,582,671 | 6/1971 | Ott | 307/117 |
| 3,713,126 | 1/1973 | Stettner | 340/258 |
| 3,732,484 | 5/1973 | McKenna | 323/19 |
| 3,761,912 | 9/1973 | Stettner et al. | 307/293 |
| 3,790,848 | 2/1974 | Lai | 315/155 |
| 3,893,081 | 7/1975 | Hopkins | 340/148 |
| 3,934,156 | 1/1976 | Galemmo et al. | 307/117 |
| 3,949,366 | 4/1976 | Spillar et al. | 340/171 |
| 3,979,601 | 9/1976 | Franklin | 307/141 |
| 4,021,679 | 5/1977 | Bolle et al. | 307/117 |
| 4,024,413 | 5/1977 | Olita | 307/117 |
| 4,099,168 | 7/1978 | Kedjierski et al. | 340/517 |
| 4,159,473 | 6/1979 | Senk | 340/565 |
| 4,189,701 | 2/1980 | Torok | 367/2 |
| 4,198,574 | 4/1980 | Price et al. | 307/97 |
| 4,344,071 | 8/1982 | Allen | 340/566 |
| 4,361,767 | 11/1982 | Pelka et al. | 307/117 |
| 4,408,308 | 10/1983 | Smith et al. | 340/825.72 |

Primary Examiner—Donald J. Yusko
Attorney, Agent, or Firm—Townsend and Townsend

[57] ABSTRACT

A sound actuated switch including a microphone coupled via an audio amplifier to a reset circuit. When a sound of sufficient intensity is received by the microphone a reset signal is supplied to the counter portion of an oscillator and counter circuit. The counter then begins counting oscillations and produces an "on" control signal until a predetermined count is reached, at which time an "off" control signal is produced. The control signal is supplied to the gate of a switching triac in a switch circuit. The presence of the on control signal causes the switching triac to electrically connect an AC power source to a load, typically a light. A simple, high efficiency DC power supply is also disclosed.

11 Claims, 3 Drawing Figures

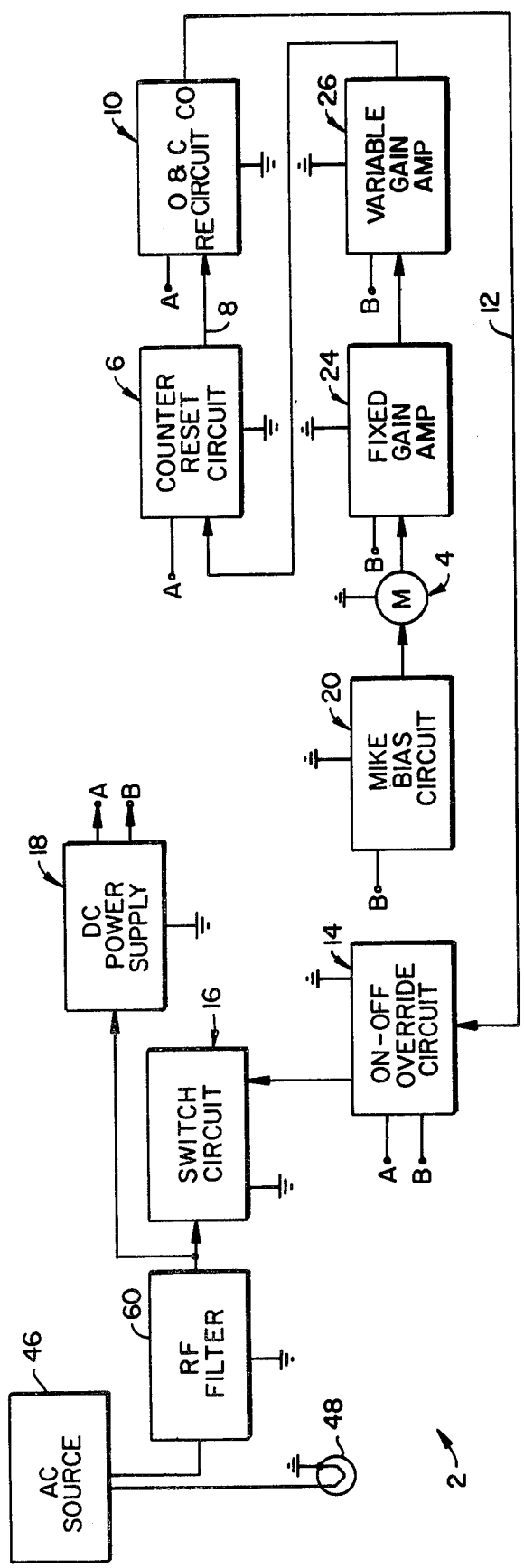
FIG._1.
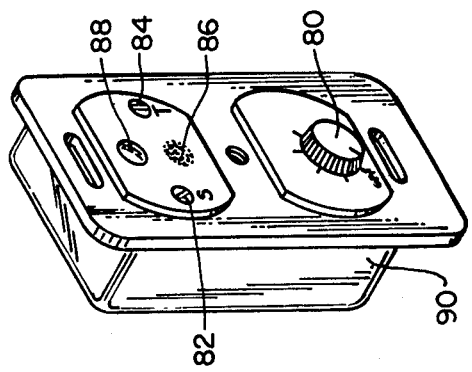
FIG._3.

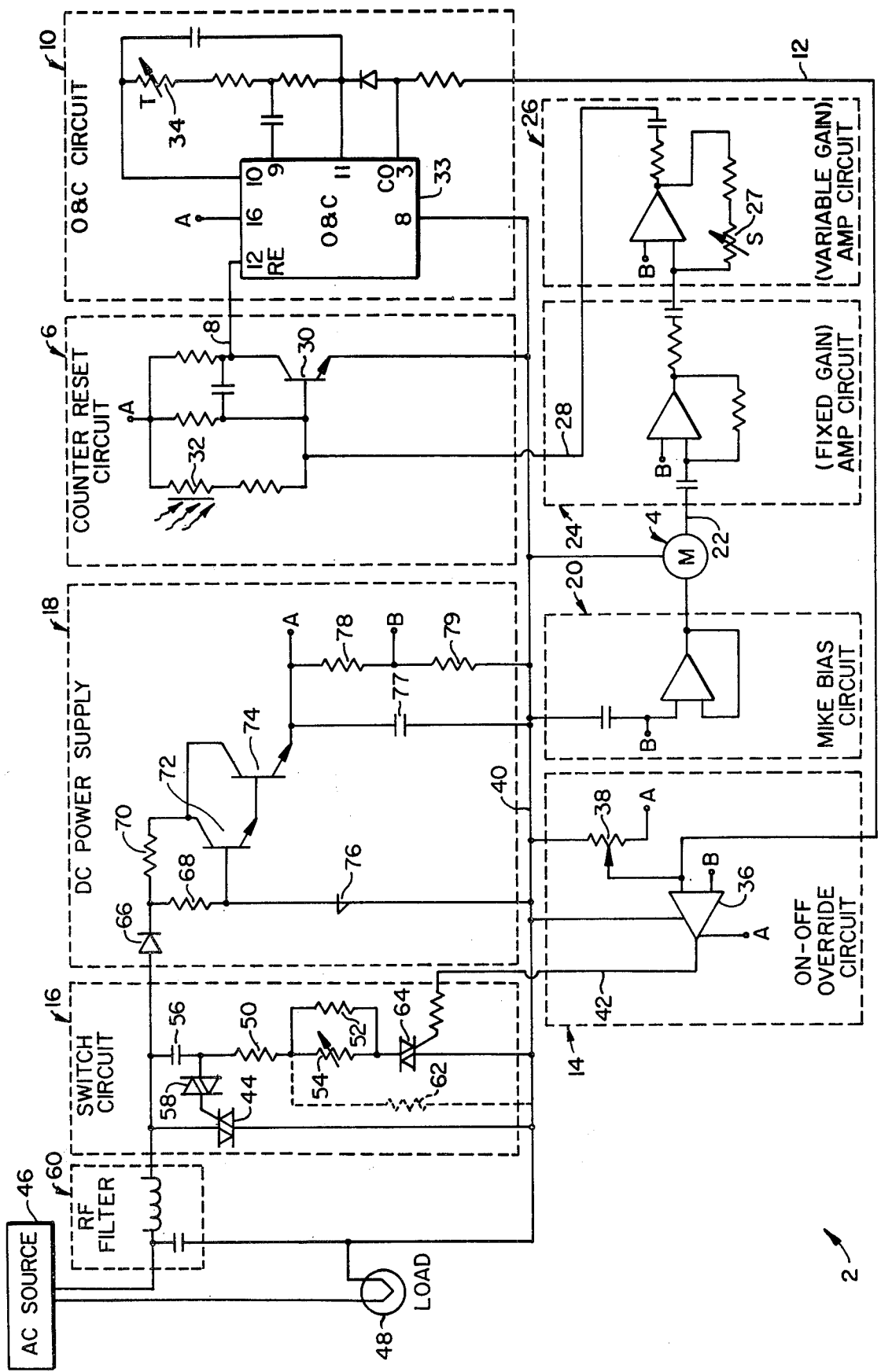
FIG._2.

SOUND ACTUATED LIGHT SWITCH

This is a continuation of application Ser. No. 273,570, filed June 16, 1981 now U.S. Pat. No. 4,408,308.

BACKGROUND OF THE INVENTION

This invention is related to sound actuated switches and in particular a switch which is actuated by a sound of sufficient magnitude to turn the switch on for a predetermined period of time and to maintain the switch on for as long as sounds of sufficient magnitude are received.

One use of sound actuated switches is as a burglar deterrent. Certain burglar deterrent devices actuated by sounds, as exemplified by U.S. Pat. No. 4,099,168, are sensitive to certain types of sounds, such as that of breaking glass or splintering wood, which signal a forced entry. U.S. Pat. No. 4,103,294 discloses a different type of sound actuated burglar deterrent. The device acts as a switch which illuminates a light for a period of time, say five seconds, in response to a sound and extinguishes the light for another period of time, say three seconds. Continuous noise causes the continuously alternating illumination and extinguishment of the lights to scare the burglar away.

It may be desired to use a sound actuated switch in a commercial establishment in lieu of or in addition to a standard light switch so that when there is little activity in the room, the lights would automatically shut off. When so used they would be both a convenience and an energy saver. Such switches could also be used in situations when it would be impractical or difficult to reach a light switch, such as in a dark hallway or in a garage or when the switch is behind a piece of furniture.

Unfortunately, because of their specialized operational characteristics, such burglar deterrent sound actuated switches are not particularly suited for many other uses. First, the circuitry is often sensitive to only higher frequency noise. Normal speech is often ineffective. Second, burglar alarm type switches commonly require that the sound be maintained for a certain period, generally to avoid "false alarms." Third, the circuitry of the prior art burglar alarm type of sound actuated switch does not particularly lend itself to individualized, flexible operation, such as the timing of the period during which the switch is left on in response to a noise. Of course switches which flash the lights on and off are unacceptable for normal use.

Another drawback with the prior art sound actuated switches is that their internal power supplies are usually somewhat inefficient. Commonly, the power supply for the switch incorporates one or more zener diodes, a rather inefficient method of producing direct current. Such a power supply would generally not be particularly suitable for enclosing within a box with a wall (such as a replacement for a standard wall switch) because of the heat generated.

Thus, while the concept of a sound actuated switch is attractive, the lack of flexibility and energy efficiency has prevented the potential benefits from being realized on any substantial scale.

SUMMARY OF THE INVENTION

The present invention provides a flexible, energy efficient sound actuated switch suitable for use as a replacement for a standard wall switch.

Broadly, the invention includes a microphone coupled via an audio amplifier to a reset circuit. When a sound of sufficient intensity is received by the microphone and the signal is amplified, a reset signal is supplied to the counter portion of an oscillator and counter (O&C) circuit. The counter then begins counting oscillations and produces an "on" signal until a predetermined count is reached, at which time an "off" control signal is produced. These control signals are supplied to the gate of a switching triac in a switch circuit. The presence of the on control signal causes the switching triac to electrically connect an AC power source to a load, typically a light. A simple, high efficiency DC power supply is also disclosed.

The switch is spliced into one leg of an electrical circuit between the load and the alternating current source. An RF filter is used to prevent interference in the lines. AC is supplied through the RF filter directly to the switch circuit and to a DC power supply. The DC power supply uses a voltage divider to provide two sources of direct current at terminals A and B. The switch circuit preferably includes components which allow the light switch to also act as a dimmer.

A mike bias amplifier biases the microphone. The output of the microphone (or mike) is coupled to a fixed gain audio amplifier. A variable gain audio amplifier is used to modify the output from the fixed gain amplifier to adjust the sensitivity of the unit to sounds.

The output from the variable gain amplifier is connected to the counter reset circuit which produces a reset signal when the signal from the variable gain amplifier is above a chosen value. A photoresistor in the counter reset circuit alters the value such signal must be before the reset signal is produced. When the room is well-lit from natural daylight, the magnitude of the sound required to produce a reset signal is increased to effectively reduce the sensitivity of the device.

The counter portion of the O&C circuit accepts the reset signal and produces an on control signal at a counter output. The counter output is connected to the oscillator and causes the oscillator to begin oscillating. The counter counts the oscillations from the oscillator. Once the counter has counted a predetermined number of oscillations, it produces an off control signal at the counter output. The off control signal shuts down the oscillator. A variable resistor is used to modify the frequency of the oscillator so that the time period it takes to reach the predetermined number can be varied.

The counter output is connected to an on/off override circuit which uses a variable resistor to alternatively tie the control signal line to ground or couple it directly to terminal A of the DC power supply thereby overriding the control signal. Intermediate positions of the variable resistor allow the on and off control signals to control the operation of the switching triac in the switch circuit.

Thus, when a sound produces a signal from the mike of sufficient magnitude, as amplified by the fixed gain and variable gain amplifiers, a reset signal is produced by the reset circuit to activate the counter. While the counter is counting, the on control signal is produced to activate the switch circuit to turn on the load, typically a light, unless it is overriden by the on/off override circuit. After the counter has reached the predetermined number, the off control signal is produced resulting in the light being turned off by the switch circuit (again, unless overriden by the on/off override circuit).

In contrast with the prior art, which frequently varies the time period during which certain circuit components are operational by varying the time it takes to charge a capacitor, the O&C circuit of the invention provides a compact, accurate and highly adjustable means for varying the time during which the switch is activated. A single sound of sufficient magnitude produces a reset signal to the O&C circuit which produces an on control signal to power the load.

The counter reset circuit includes a light sensitive element which reduces the circuit's sensitivity so that when the room is illuminated, such as by daylight, a much louder sound must be received to produce a reset signal. Thus, during normal daylight hours in a room naturally well illuminated by daylight, the light would not normally be activated. Since the amplification of the signal from the microphone can be varied, the proper sensitivity is assured.

By the use of a switch made according to the present invention much energy can be saved compared with standard light switches. In many commercial buildings, and also in many homes, the occupants often fail to turn off lights when leaving a room. With a device made according to the present invention, the occupants need not either turn on the light or turn them off for the sounds from normal activities will actuate the light. A light tap on the device may also be used to activate the device when entering a room. When the room is vacant, and thus when the appropriate sounds are not present, the light will be turned off. Substantial savings in electricity can result.

In certain areas, such as hallways and stairs, a switch made according to the present invention can be used to great advantage. Persons need not fumble around in the dark groping for a light switch, for a mere sound will actuate the lights. Since the light will extinguish once sounds are no longer present, three-way switches, that is one on each end of the hall or at each end of the stairway, are not required to reduce wiring costs. Switches made inaccessible by furniture or equipment can also be replaced with a switch made according to the invention to eliminate that problem. Also, some rooms have two entrances but only a single switch. Using a switch of the present invention enables persons entering from either entrance to activate the light by simply making a sound.

The D.C. power supply of the invention is especially designed to use very little energy. It includes cascading transistors in the Darlintgon configuration provided with rectified current. An electronic switch grounds the base of the first transistor when the voltage thereat is above about 6 to 8 volts so the transistors are active only when there is a current demand on the power supply and only when the voltage at the first transistor base is between 0 and 6 to 8 volts. The D.C. power supply is therefore well suited for mounting in a small enclosure, such as a box mounted within a wall to replace a standard light switch.

The switch circuit includes a switching triac, the gate of which is coupled to an RC circuit portion including a variable resistor so that the light switch also acts a presettable dimmer. Thus, when used with incandescent lights, flexibility and economy is achieved. The light can be set to a desired degree of illumination so that electricity is not wasted. Further, the life of incandescent bulbs can be lengthened by burning them at lower power settings.

Thus, the sound actuated switch of the present invention provides the user with a flexible, energy efficient device suitable for mounting within a wall and adjustable in its response to the level of sound required for activation and the length of time the light will stay on in response to a sound.

Other features and advantages of the present invention will be apparent from the following description in which the preferred embodiment has been set forth in detail in conjunction with the accompanying drawings.

BRIEF DESCRIPTION OF THE DRAWINGS

FIG. 1 is a block diagram of the light switch made according to the present invention.

FIG. 2 is a more detailed schematic of the switch of FIG. 1.

FIG. 3 is a perspective view of the outside of a switch made according to the present invention.

DETAIL DESCRIPTION OF THE PREFERRED EMBODIMENT

Turning now to FIG. 1, the switch 2 of the present invention includes broadly a microphone 4 coupled to a counter reset circuit 6 which produces a reset signal along signal line 8 for input into the reset input (labeled RE) of an oscillator and counter (O&C) circuit 10. Upon receipt of a reset signal the O&C circuit produces an on/off control signal at its control output (labeled CO) on a control signal line 12. The on/off control signal is coupled to an on/off override circuit 14 which controls a switch circuit 16. Switch circuit 16 controls the flow of current between an AC power source 46 and a load, typically a light, 48. A DC power supply 18 provides the various circuit components with a source of direct current at outputs labeled A and B.

Referring now also to FIG. 2, microphone 4 is shown driven by a mike bias amplifier 20 to produce a first signal on a signal line 22 and is capacitively coupled to a fixed gain sound amplifier 24, the output of which is capacitively coupled to a variable gain, user-adjusted, amplifier 26. By adjusting variable resistor 27, the gain of amplifier 26 can be modified to suit the user and the environment. Microphone 4 is located behind a perforated area 86 of an enclosure 90 as seen in FIG. 3. Due to the frequency response of the microphone and the use of relatively small holes in perforated area 86, the unit is more sensitive to higher frequency sounds than low frequency sounds. Thus, most lower frequency sounds, which can pass through the walls of a room, will generally not be amplified sufficiently by amplifiers 24 and 26 to cause a reset signal on signal line 8 to be produced. Therefore the switch is less sensitive to noises from outside the room than from within.

Variable gain amplifier 26 produces a second signal on a second signal line 28 which is coupled to the base of a transistor 30. When the second signal reaches a sufficient (chosen) level, transistor 30, which is normally biased on, switches off producing the reset signal on signal line 8. A photoresistor 32 is used to bias the base of transistor 30 to adjust the magnitude that the second signal on signal line 28 must reach to produce a reset signal on line 8. When the room is dark, photoresistor 32 has a very high resistance, effectively an open circuit, while in full daylight the resistance is reduced by orders of magnitude. When the room is well lighted, the bias is greater so that the level which the second signal on signal line 28 must achieve (the chosen level) is greater than that received when the room is dark.

Photoresistor 32 is preferably less sensitive to wavelengths of artificial lighting so that after the lights are turned on by the unit, the sensitivity of the unit is not greatly reduced.

O&C circuit 10 preferably comprises a single O&C integrated circuit chip 33 having both an oscillator and a counter, such as that made by Motorola Semiconductor Products, Inc. of Phoenix, Ariz. as Part No. MC 14060B. The reset input pin (labeled RE) of chip 33 is connected to the collector of transistor 30 to accept a reset signal on line 8. Upon receipt of a reset signal, the counter produces an on control signal at the counter output pin (labeled CO) of chip 33 which activates the oscillator and is carried along control signal line 12. When the counter has reached a predetermined count, an off control signal is produced at the counter output pin to shut down the oscillator and to be carried along control signal line 12. The occurence of a reset signal during a counting sequence causes the counter to reset so that so long as sounds of sufficient magnitude are received by microphone 4 before the predetermined count is reached, an on control signal will be present at the counter output pin. A variable resistor 34 is used to vary the frequency of oscillation of the oscillator allowing the user to change the time during which it takes the counter to reach the predetermined count.

The on/off control signal from O&C circuit 10 is amplified by an amplifier 36 in on/off override circuit 14. The on control signal is low while the off control signal is high. Since amplifier 36 is an inverting amplifier the pseudo on control signal is high while the pseudo off control signal is low.

Line 12 is also connected to the wiper of a variable resistor 38 which is connected to a common line 40 at one end and to voltage output A at the other. Amplifier 36 produces a pseudo on/off control signal on a signal line 42 in response to the signal on line 12 and the location of the wiper of variable resistor 38. When the wiper is connected directly to either common line 40 or power supply output A, the control signal on line 12 is overriden so that either a pseudo on or pseudo off signal, respectively, is produced on signal line 42. Intermediate positions of the wiper of variable resistor 38 does not significantly affect the control signal on line 12.

The pseudo control signal on line 42 is connected to the gate of a control triac 64 in switch circuit 16. The control triac controls the current through an RC network made up of resistors 50, 52, variable resistor 54 and capacitor 56.

The RC network of resistors 50, 52, and 54 and capacitor 56 drives the gate of triac 44 throught a pulse shaping diac 58 in a manner similar to conventional dimmer switches. Variable resistor 54 is ganged to variable resistor 38, preferably using a ganged rotary potentiometer (variable resistor) having multiple detents, so that both are operated simultaneously. A multiple position detend potentiometer insures that the wiper of variable resistor 38 is either completely to one end or the other or within in intermediate position which is not so close to either end to allow the control signal to be inadvertently overridden. The ganging of resistors 38 and 54 is done to save space and allow both functions, that is the on/off override and the dimmer function, to be performed via a single rotary switch.

If the dimmer feature is not desired, for example where the load includes fluorescent lights, resistors 52, 54 and capacitor 56 can be omitted. In such a case a three position switch could be used in lieu of variable resistor 38 for connection to common line 40, open, and connection to power output A.

An RF filter 60 is provided between source 46, switch 2, and load 48 to reduce interference to radios and such by switch 2.

A resistor 62 is shown in dotted lines connecting the junction of resistor 50 and variable resistor 54 with common line 40 and is used when a minimum light level is desired at all times. This may be useful in a bathroom, as a safety feature, or to reduce the risk of burglaries. The activation of the switch by a sound of sufficient magnitude will cause the switch to operate in a normal manner. However, after the counter has reached its full count and an off control signal is provided along signal line 12, switching triac 44 will remain activated providing a load with a small amount of power, in effect a low power dimmer setting.

A rectifier 66 in DC power supply 18 is connected to AC power source 46 to provide half wave rectified current to resistor 68, 70. The rectified alternating current is supplied to the collectors of transistors 72, 74 through resistor 70 and also to the base of transistor 72 through resistor 68. The input of a silicon bilateral switch (SBS)76 is connected to the base of transistor 72 while the output of SBS 76 is connected to common line 40. As the voltage of AC source 36 rises above zero, transistors 72, 74 charge a filter capacitor 77 connected between the emitter of transistor 74 and common line 40. When the voltage across SBS 76 reaches its switching voltage, typically between 6 and 8 volts, the SBS becomes a closed circuit grounding the base of transistor 72 thus halting the charging of filter capacitor 77 until the voltage from AC source 46 again rises above zero. Resistors 78, 79 parallel capacitor 77 between the emitter of transistor 74 and common line 40 to act as a voltage divider providing two DC power outputs A and B. The individual circuit components are powered by connection to the appropriate DC power outputs A or B of logic power circuit 18.

Power circuit 18 provides a stable DC power supply with very little heat dissipation such as occurs in power supplies incorporating zener diodes. The transistors only charge capacitor 77 when circuit power requirements discharge the capacitor and then only during the initial voltage rise of the AC power source until SBS switch 76 grounds the base of transistor 72. Since the transistors are active only when filter capacitor 77 is discharged, the dissipation of power and heat through transistor 72, 74 is reduced. Because the value of resistor 68 is quite large, the power dissipated through it and SBS 76 when SBS 76 becomes a closed circuit is small. It has been found that a switch made according to the disclosed preferred embodiment draws less than 40 milliwatts of power making it suitable for use in a sealed environment where heat disipation must be minimized.

Having described the structure of the preferred embodiment, its operation will now be discussed. Sounds recieved by microphone 4 produce a first signal on signal line 22, line 22 being connected to fixed gain amplifier 24. Microphone 4 is located behind a perforated area 86 of an enclosure 90 as seen in FIG. 3. The output of amplifier 24 is connected to variable gain amplifier 26. The user can adjust the level of the second signal produced by amplifier 26 on signal line 28 using variable resistor 27. This is accomplished by turning an adjustment screw 82, labeled S for sensitivity, illustrated in FIG. 3. Signal line 28 is connected to the base of transistor 30 which is normally biased on. When the second signal on signal line 28 reaches a chosen level, transistor 30 shuts off producing a reset signal on signal line 8 which is applied to the reset input pin on the oscillator and counter chip 33. Photoresistor 32 biases transistor 30 when the switch is in a naturally illuminated area thereby requiring the second signal along signal line 28 to be greater to activate transistor 30. The response of photoresistor 32 is preferably greatest in the daylight spectrum. Light reaches photoresistor 32 through a lens 88 on enclosure 90.

The counter is reset upon receipt of the reset signal on signal line 8 and produces an on control signal at the counter output pin. This on control signal activates the oscillator which drives the counter until the counter reaches its predetermined value. The frequency of the counter can be varied by the use of variable resistor 34 thus changing the length of time it takes the counter to reach a predetermined value. The user changes variable resistor 34 via an adjustment screw 84, labeled T for time, shown in FIG. 3. After the counter has reached its predetermined value, an off control signal is produced at the counter output to shut down the oscillator.

The control signal at the counter output pin is provided via signal line 12 to on/off override circuit 14. The wiper of variable resistor 38 is connected to signal line 12 to permit resistor 38 to override the control signal on line 12. Resistor 38 is controlled by rotating knob 80. If the wiper is connected to common line 40, an on control signal will be applied to amplifier 36 regardless of whether or not control signal is an on or an off control signal. Similarly, if the wiper of variable resistor 38 is coupled to DC power output A, the control signal provided amplifier 36 on signal line 12 becomes on off control signal regardless of whether the control signal from the counter output pin of the O&C chip is an on or an off control signal. Placement of the wiper of variable resistor 38 along intermediate portions of the variable resistor does not effectively change the control signal applied to amplifier 36.

A pseudo on/off control signal is provided along signal line 42 from amplifier 36 to switch circuit 16. There the pseudo control signal is coupled to the gate of a control triac 64. By changing the position of variable resistor 54 (using knob 80), the user can vary the portion of time switching triac 44 is on so that switch 2 acts as a dimmer for load 48.

As shown in FIG. 3, a switch made according to the present invention can be configured to replace a standard wall switch and using a conventional two-hole plug plate to cover the switch. If the user desires to turn the light off and keep it off, knob 80, which is ganged to variable resistors 38 and 54, is rotated in a full, counterclockwise direction. The wiper of variable resistor 38 is thereby connected to DC power output A to insure that a pseudo off signal is produced by amplifier 36 to keep switching triac 44 non-conducting. Full clockwise rotation of knob 80 connects the wiper of resistor 38 to common line 40 so that a pseudo on signal is provided the gate of control triac 64. Rotating knob 80 to intermediate positions activates the switch so that the load will be connected to AC power source 46 through switching triac 44 when microphone 4 receives a sound of sufficient magnitude. Intermediate positions of knob 80 also produces the dimmer action of switch circuit 16.

On/off override circuit 14, mike bias circuit 20 and amplifier circuits 24, 26 are shown as separate components. However their respective amplifiers are preferably on a single integrated circuit chip, such as one made by National Semiconductor Corporation of Santa Clara, Calif., and designated part number LM 324.

Although the present invention has been described with reference to the disclosed preferred embodiment, modification and variation can be made without departing from the subject of the invention as defined in the following claims. For example, instead of microphone 4, a different type of external stimulus sensor, such as one sensitive to light or vibration, could be used. Further, the load, although preferably a light, could be some other type of device, such as a radiant heater or an alarm which emits a short burst of sound. The load could also be a recorder which plays a prerecorded message, such as a warning to "Watch your step" or the recorder could be used in an exhibit hall with prerecorded instructions describing the next exhibit. Of course if the load produces a stimulus which the sensor is sensitive to, such as an audio recording used with a microphone, the length of the recording must be shorter than the time it takes the counter to reach a full count otherwise the load may never shut off. Although the preferred embodiment is shown replacing a standard light switch, it could be used in conjunction with other switches for controlling power to a load.

We claim:

1. A switch connected in series with and between an alternating current power source and a load for actuation of the load upon receipt of an audible external stimulus comprising:
   a direct current power supply connected to said alternating current power source and having at least one direct current output;
   means for sensing said audible external stimulus and producing a first electrical signal representative of the stimulus at a first output thereof;
   a reset circuit means having a reset circuit input electrically coupled to the first output for producing a reset signal at a reset output when the electrical signal at the reset circuit input exceeds a chosen level;
   timing means coupled to the reset output for providing on and off control signals at a control output, said on control signal provided during receipt of the reset signal and for a first period of time after said reset signal ceases, said off control signal provided thereafter;
   said timing means further comprising an electronic oscillator means for producing an oscillating signal and an electronic counter coupled to the oscillator means and having a reset input coupled to the reset output and adapted to begin a count cycle by counting oscillations of the oscillating signal starting at a first count upon receipt of said reset signal, said counter means including means for producing an on control signal at a counter upon receipt of said reset signal and an off control signal after the electronic counter reaches a certain count corresponding to a predetermined time interval during which said reset signal is not received; and
   connecting switch means, having a switch input connected to said control output and being responsive to said control signal, for electrically connecting the alternating current power source to the load when the on control signal is present.

2. The switch of claim 1 wherein the sensing and producing means includes a microphone.

3. The switch of claim 1 wherein said oscillating means is adjustable so that the frequency of the oscillating signal can be varied to change the rate at which the electronic counter reaches said certain count at which said off control signal is produced, said predetermined time interval varying accordingly.

4. The switch of claim 1 further comprising an on-off override means connected between the electronic counter output and the switch input of the connecting switch means, said override means being continuously adjustable between a first position wherein said switch input is disconnected from said electronic counter output and a second position wherein said switch input is connected to said electronic counter output.

5. An electronic device for completing an electric circuit between a source of alternating current and a load upon receipt of an audible sound, comprising;
   means connected to said alternating current source for providing a supply of direct current;
   an acoustic pickup adapted to produce a first signal at a first output;
   means coupled to said first output for amplifying said first signal to produce a second signal at a second output;
   a reset circuit means coupled to said second output for producing a reset signal at a reset output when said second signal exceeds a chosen level;
   an electronic oscillator means for producing an oscillating signal at a selectable frequency;
   an electronic counter means operably coupled to said oscillator means and having a reset input operably coupled to said reset output and adapted to begin a new count cycle by counting oscillations of said oscillating signals starting at a first count value upon receipt of each said reset signal, said counter means including means for continuously producing an on control signal at a counter output upon receipt of said reset signal and until the count of said counter means reaches a second count value corresponding to a predetermined time interval during which said reset signal is not received and for producing an off control signal thereafter; and
   connecting switch means, having a switch input connected to said counter output and being responsive to said control signal, for electrically connecting the source to a load when said on control signal is present.

6. A device of claim 5 wherein said direct current providing means further comprises:
   a current rectifier having an input and output connected to said alternating current source at its output and providing direct current at its output;
   amplifier means having an amplifier means input connected to the rectifier output, an amplifier means output, and a control terminal; and
   a silicon bilateral switch having switch input connected to the control terminal and a switch output connected to a common line, said switch adapted to remain substantially open until the voltage at said switch input reaches a switching value whereupon said switch closes causing the voltage at said control terminal to be substantially equal to the voltage of the common line.

7. The device of claim 5 wherein said reset circuit means includes light sensitive means for altering the value of said chosen level in proportion to the level of ambient light on said light sensitive means.

8. The device of claim 5 wherein said oscillator means includes means for varying said selected frequency to change the rate at which the electronic counter reaches said certain count at which said off control signal is produced, said predetermined time interval varying accordingly.

9. The device of claim 5 further comprising on-off means connecting said counter output and said switch means input for selectively overriding said control signal by providing a pseudo-on control signal corresponding to said on control and a pseudo-off control signal corresponding to said off control signal at said switch means input.

10. The device of claim 5 wherein said connecting switch means includes dimmer means for selectively altering the percentage of time said switch means connects said source to said load during each alternating current cycle when said on control signal is present.

11. The device of claim 5 further comprising means connecting the alternating current source with the connecting switch means for reducing the transmission of radio frequency interference signals into said electric circuit.

* * * * *